(12) United States Patent
Mendel et al.

(10) Patent No.: US 8,692,595 B1
(45) Date of Patent: Apr. 8, 2014

(54) TRANSCEIVER CIRCUITRY WITH MULTIPLE PHASE-LOCKED LOOPS

(71) Applicant: Altera Corporation, San Jose, CA (US)

(72) Inventors: David W. Mendel, Sunnyvale, CA (US); Sergey Shumarayev, Los Altos Hills, CA (US); Ramanand Venkata, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/829,995

(22) Filed: Mar. 14, 2013

(51) Int. Cl.
*H03L 7/18* (2006.01)
*H03L 7/093* (2006.01)

(52) U.S. Cl.
USPC .......................................... 327/156; 327/147

(58) Field of Classification Search
CPC .......... H03L 7/18; H03L 7/093; H03L 7/0891
USPC .................................................. 327/147, 156
See application file for complete search history.

(56) References Cited

U.S. PATENT DOCUMENTS

| | | | |
|---|---|---|---|
| 8,351,490 B2 | 1/2013 | Chen et al. | |
| 2008/0317185 A1* | 12/2008 | Mueller et al. | 375/376 |
| 2009/0011733 A1* | 1/2009 | Akiya | 455/165.1 |
| 2009/0156149 A1* | 6/2009 | Plevridis et al. | 455/260 |
| 2009/0254781 A1* | 10/2009 | Bonaccio et al. | 714/48 |
| 2009/0258605 A1* | 10/2009 | Boos | 455/73 |
| 2010/0273442 A1* | 10/2010 | Zeng et al. | 455/208 |
| 2011/0037501 A1* | 2/2011 | Ali et al. | 327/105 |
| 2011/0080528 A1* | 4/2011 | Deleon | 348/731 |
| 2013/0082754 A1* | 4/2013 | Chern et al. | 327/157 |
| 2013/0122840 A1* | 5/2013 | Jung et al. | 455/226.1 |
| 2013/0195235 A1* | 8/2013 | Ferris et al. | 375/362 |

FOREIGN PATENT DOCUMENTS

| | | |
|---|---|---|
| WO | 9851014 | 11/1998 |
| WO | 2005117264 | 12/2005 |

* cited by examiner

*Primary Examiner* — Adam Houston
(74) *Attorney, Agent, or Firm* — Jason Tsai

(57) ABSTRACT

An integrated circuit with at least two LC-based phase-locked loop circuits and a high-speed serial interface circuit having multiple channels is provided. Each phase-locked loop circuit may include an oscillator having a varactor and multiple inductors. The oscillator may be configured to generate signals at different frequency ranges as determined by the inductors and the varactor. The LC-based phase-locked loop circuits may be produced such that all frequency ranges together provide the continuous coverage of an octave, thereby enabling the phase-locked loop circuits to generate a clock signal with high quality factors and desirable phase noise and jitter performance at an arbitrary frequency. Since the channels of the high-speed serial interface circuit may receive a clock signal having an arbitrary frequency, the high-speed serial interface circuit may be configured to support any communications protocol.

21 Claims, 7 Drawing Sheets

TRANSCEIVER CIRCUITRY WITH MULTIPLE PHASE-LOCKED LOOPS

BACKGROUND

Phase-locked loop circuits based on LC-based voltage-controlled oscillators (e.g., voltage-controlled oscillators (VCOs) that include inductors and capacitors) may exhibit high quality factors and desirable phase noise and jitter performance in comparison to ring-based voltage-controlled oscillators. Therefore, phase-locked loop circuits with LC-based VCOs are often used for generating clock signals used by high-speed serial interface circuits.

The operating frequency range of a phase-locked loop circuit may be limited by the frequency tuning range of its voltage-controlled oscillator. A conventional LC-based voltage-controlled oscillator generally has one or more fixed inductors (i.e., inductors that have a fixed inductance value) and a varactor (i.e., a voltage-controlled capacitor). Because the value of the inductance is fixed, the frequency tuning range of the oscillator is limited by the number of inductors and the amount of capacitance tuning that can be achieved using the varactor.

A situation may arise where the phase-locked loop circuit is not able to generate a clock signal within a given frequency range. Consequently, any communications protocol that relies on a clock signal within that given frequency range cannot be supported by a high-speed serial interface circuit that receives its clock signal from such a phase-locked loop circuit.

SUMMARY

In accordance with certain aspects of the invention, an integrated circuit includes first and second LC-based phase-locked loop (PLL) circuits. The first phase-locked loop circuit may be configured to generate a first control signal having a first frequency in a first frequency range. The second phase-locked loop circuit may be configured to generate a second control signal having a second frequency in a second frequency range. The first and second frequency ranges may overlap with each other. The integrated circuit further includes a high-speed serial interface circuit with multiple channels with each channel being coupled to at least one of the LC-based phase-locked loop circuits.

The first and second frequency ranges may be continuous. For example, the overlapping part of the first and second frequency ranges may cover a portion of the lower part of the second frequency range and a portion of the upper part of the first frequency range.

It is appreciated that the present invention can be implemented in numerous ways, such as a process, an apparatus, a system, a device, or a method on a computer readable medium. Several inventive embodiments of the present invention are described below.

In certain embodiments, the above-mentioned high-speed serial interface circuit may yet further have a first portion of the channels coupled to the first phase-locked loop circuit and a second portion of the channels to the second phase-locked loop circuit.

If desired, the first and second frequency ranges may be continuous with the upper limit of the second frequency range having at least twice the frequency compared to the lower limit of the first frequency range.

Further features of the invention, its nature and various advantages, will be more apparent from the accompanying drawings and the following detailed description of the preferred embodiments.

DETAILED DESCRIPTION

The present invention relates to integrated circuits and more specifically to integrated circuits with high-speed serial interface circuits and phase-locked loop circuits.

Phase-locked loop circuits based on LC-based voltage-controlled oscillators (e.g., voltage-controlled oscillators (VCOs) that include inductors and capacitors) may generate clock signals used by high-speed serial interface circuits. However, LC-based phase-locked loop circuits have a limited operating frequency range which is determined by the number of inductors and the amount of capacitance tuning that can be achieved using a varactor (i.e., a voltage-controlled capacitor). Optional frequency divider circuitry may divide the frequency of the generated clock signal, thereby effectively enhancing the frequency range covered by the phase-locked loop circuit.

A situation may arise where the phase-locked loop circuit is not able to generate a clock signal within a given frequency range that is required by a particular communications protocol.

It may therefore be desirable to provide more than one LC-based phase-locked loop circuit to support a high-speed serial interface circuit and to configure the different LC-based phase-locked loop circuits such that all frequency ranges together cover an octave (i.e., a continuous frequency range having upper and lower frequency limits, where the upper frequency limit is at least twice the lower frequency limit). In this scenario, one LC-based phase-locked loop circuit alone may generate clock signals from disjoint frequency ranges (i.e. from non-continuous frequency ranges). Together the different LC-based phase-locked loop circuits may generate a clock signal having a frequency selected from a continuous frequency range as supported by all of the LC-based phase-locked loop circuits together and may provide such a clock signal to the high-speed serial interface circuit.

It will be recognized by one skilled in the art, that the present exemplary embodiments may be practiced without some or all of these specific details. In other instances, well-known operations have not been described in detail in order not to unnecessarily obscure the present embodiments.

Figure 1:
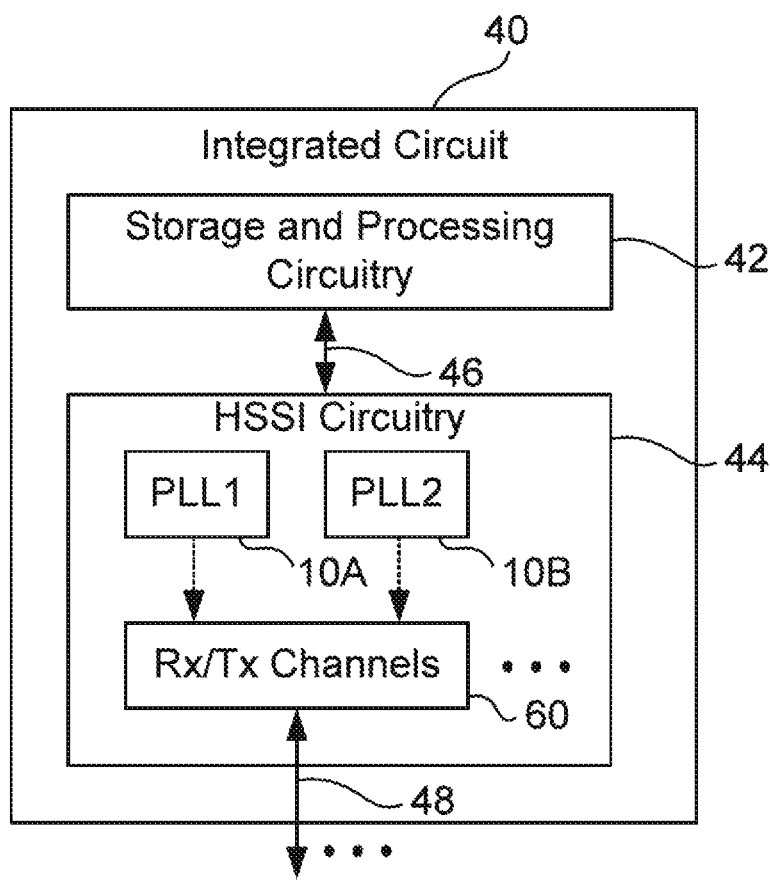
FIG. 1 is a diagram of an illustrative integrated circuit in accordance with an embodiment of the present invention.

An illustrative embodiment of an integrated circuit 40 in accordance with the present invention is shown in FIG. 1. Integrated circuit 40 may have multiple components. These components may include storage and processing circuitry 42 and high-speed serial interface (HSSI) circuitry 44. Storage and processing circuitry 42 may include embedded microprocessors, digital signal processors (DSP), arithmetic circuitry, logic circuitry, microcontrollers, or other processing circuitry. The storage and processing circuitry 42 may further have random-access memory (RAM), first-in first-out (FIFO) circuitry, stack or last-in first-out (LIFO) circuitry, read-only memory (ROM), or other memory elements. Internal interconnection resources 46 such as conductive lines and busses may be used to send data from one component to another component or to broadcast data from one component to one or more other components. External interconnection resources 48 such as conductive lines and busses, optical interconnect infrastructure, or wired and wireless networks with optional intermediate switches may be used to communicate with other devices.

High-speed serial interface circuitry 44 may receive serial data from external interconnection resources 48 and deserialize the serial data before sending parallel data over internal interconnection resources 46 to storage and processing circuitry 42. High-speed serial interface circuitry 46 may also receive data from storage and processing circuitry 42 over internal interconnection resources 46, serialize the received data, and transmit the serial data over external interconnection resources 48.

High-speed serial interface circuitry 44 may include differential input-output (I/O) circuitry, serial data transceiver circuitry such as receive (Rx) and transmit (Tx) channels 60 and phase-locked loop circuitries 10A and 10B, and/or other high-speed serial interface circuitry suitable to transmit and receive data. HSSI circuitry 44 may include physical media attachment (PMA) layer circuitry which may include one or more Rx/Tx channels 60 for receiving and transmitting serial data. Each channel may have a serializer/deserializer (SerDes), pre-emphasis and equalization circuitry, or clock data recovery (CDR) circuitry. Each channel may be coupled to phase-locked loop (PLL) circuitry such as PLL1 and PLL2 (10A and 10B in FIG. 1). Each channel of the high-speed serial interface circuitry 44 may optionally include physical coding sublayer (PCS) circuitry which may include word aligner circuitry, rate matching first-in first-out circuitry, 8 bit/10 bit encoding and decoding circuitry, etc.

The clock signals generated by phase-locked loop circuits 10A and 10B may be used by one or more Rx/Tx channels 60. Receive and transmit (Rx/Tx) channels 60 may require the use of phase-locked loop circuits with high quality phase noise and jitter performance such as provided by LC-based phase-locked loop circuits.

Figure 2A:
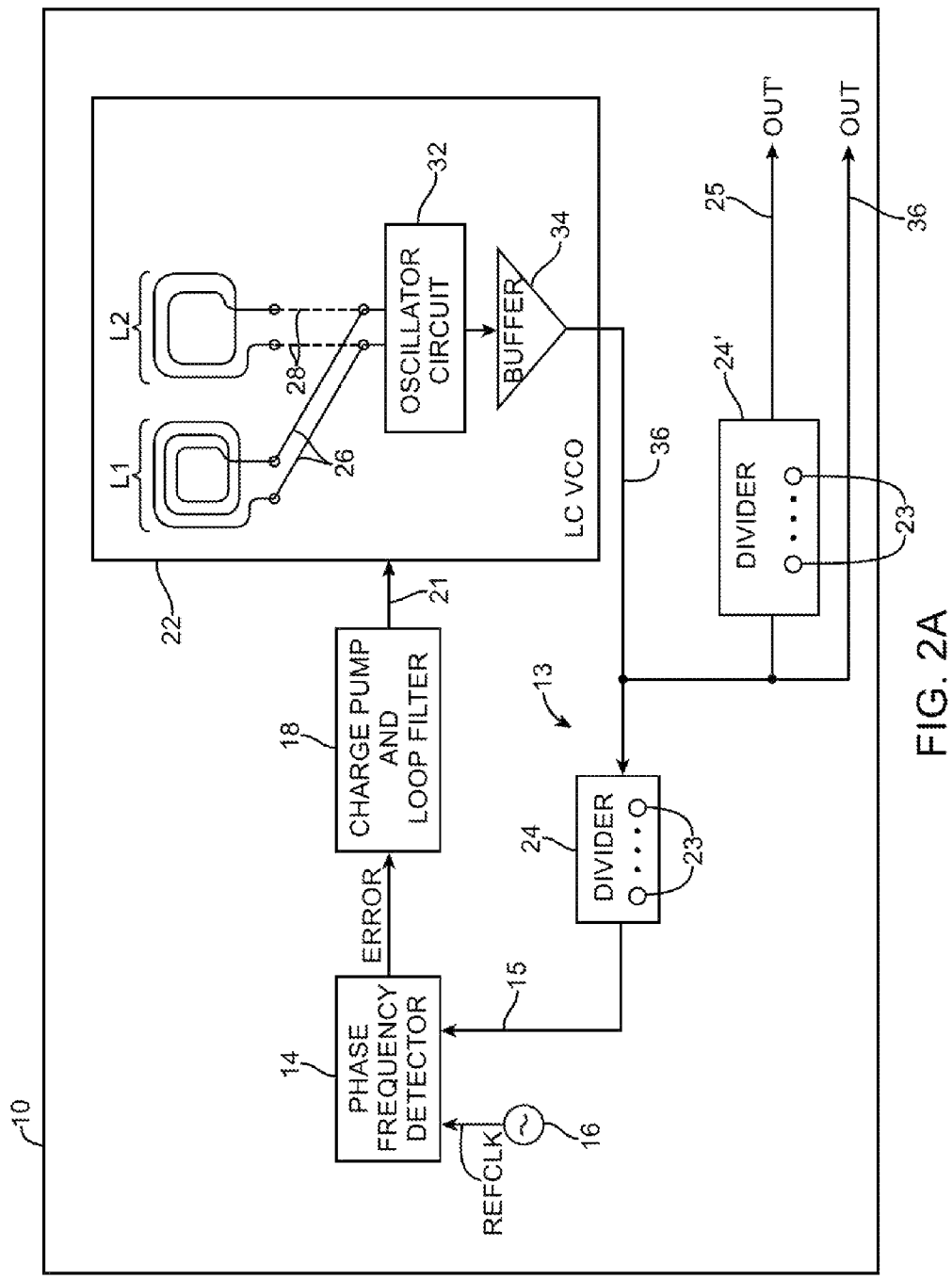
FIG. 2A is a diagram of an illustrative LC phase-locked loop (PLL) circuit in accordance with an embodiment of the present invention.

An LC-based phase-locked loop circuit having configurable inductors is shown in FIG. 2A. Inductors are passive electrical components that store energy in the form of magnetic fields. Inductors may be formed using conductive lines arranged in a loop. The conductive lines may be formed from patterned traces within layers of a dielectric stack. A dielectric stack on an integrated circuit may include layers of silicon oxide or other dielectrics within which conductive structures are formed. A dielectric stack typically includes alternating via layers and metal interconnect layers (sometimes referred to as metal layers or metal routing layers). The via layers may contain vertical conducting structures. The metal routing layers may include metal routing lines, also sometimes referred to as interconnects. Thus, inductors may be formed from loop-shaped traces in the metal routing layers and via layers in the dielectric stack.

As shown in FIG. 2A, phase-locked loop circuit 10 may be an LC-based phase-locked loop circuit (i.e., a phase-locked loop circuit that includes an inductor and a capacitor). For example, phase-locked loop circuit 10 may include a varactor or other variable capacitor and a configurable inductor formed from multiple inductors. These inductors may have the same or different inductances. Frequency tuning may be provided using a combination of inductance adjustments (e.g., to make relatively coarse frequency changes) and capacitance changes (e.g., to make relatively finer frequency changes). With this type of arrangement, an inductor may be configured to select a frequency range of interest, whereas varactor adjustments may be used to implement frequency tuning within a selected frequency range. Other configurations are also possible (i.e., arrangements in which coarse adjustments are made using varactors and fine adjustments are made using adjustable inductor circuits). Arrangements in which inductors are used for range selection are sometimes described herein as an example.

As shown in FIG. 2A, phase-locked loop circuit 10 may include a phase-frequency detector 14, an oscillator 16, charge pump and loop filter 18, a voltage-controlled oscillator 22, a divider 24, and an additional divider 24'. Phase-frequency detector 14 may receive a reference clock signal REFCLK from oscillator 16. If desired, oscillator 16 may feed signals to a frequency divider (e.g., a counter) to generate signal REFCLK. Some components of phase-locked loop circuit 10 may reside outside the phase-locked loop circuit. For example, oscillator 16 may be a crystal oscillator residing on the same printed circuit board (PCB) as the phase-locked loop circuit 10.

Phase-frequency detector 14 may also receive a feedback signal from feedback path 13 at input 15. Phase-frequency detector 14 may compare the signal on line 15 with signal REFCLK and generate a corresponding up/down control signal for charge pump and loop filter 18. The up/down control signal may direct the charge pump circuitry 18 to generate a higher or lower voltage on its output line 21, as needed to lock the frequency of circuit 12 to some integer multiple of the frequency of signal REFCLK.

Voltage-controlled oscillator 22 may have an input that is connected to line 21. Voltage-controlled oscillator 22 may generate a signal having a frequency that is controlled by adjusting the voltage level on line 21.

Voltage-controlled oscillator 22 may generate an output clock signal OUT over line 36. Line 36 is used to feed back output clock signal OUT from the voltage-controlled oscillator to divider 24. Divider 24 divides signal OUT by an appropriate integer (e.g., by two, by three, by five, etc.). Divider 24 may contain programmable elements 23, so that the integer setting of the divider may be adjusted. If desired, divider 24 may implement a non-integer division as well. For example, sigma-delta modulation methods of oscillating between two integer values may be used to generate a non-integer divisor.

The amount by which divider 24 divides clock signal OUT determines the ratio between the frequency of signal REF-CLK and signal OUT. For example, signal REFCLK may have a given frequency, and line 36 may provide a locked output clock signal at a frequency of N times the given frequency. In a typical scenario, the frequency of REFCLK might be 400 MHz and the frequency of OUT might be 1.2 GHz (as an example).

Phase-locked loop circuit 10 may include an additional divider such as divider 24'. Divider 24' may have an input that is connected to line 36 to receive clock signal OUT. Divider 24' may divide clock signal OUT by an appropriate integer (e.g., by two, by four, by eight, etc.) to produce another output clock signal OUT' on output line 25. Divider 24' may contain programmable elements 23 and may be adjusted. Lines 25 and 36 may be connected to other circuitry such as high-speed serial interface circuitry to provide other circuits with desired control clock signals.

As shown in FIG. 2A, voltage-controlled oscillator 22 may include inductors such as inductor L1 and inductor L2. Inductors L1 and L2 may each have a different number of turns. For example, inductor L1 may have three turns and inductor L2 may have two turns (see, e.g., FIG. 2A). Inductors L1 and L2 may therefore have different (unique) inductance values.

Voltage-controlled oscillator 22 may also include oscillator circuit 32 and buffer circuit 34. The oscillator circuit may be powered by a voltage regulator, which may provide a desired regulated supply voltage for the oscillator circuit. One or more of the multiple inductors (e.g., inductors L1 and L2) may be connected to oscillator circuit 32 through conductive routing lines. For example, inductor L1 may be connected to oscillator circuit 32 through metal lines 26. In this scenario, inductor L2 is not connected to oscillator circuit 32. Inductor L1 connected to oscillator circuit 32 in this way may provide voltage-controlled oscillator 22 with a first tuning range.

The metal lines (e.g., lines 26) that configure the configurable inductor to produce a desired inductance value may be formed during fabrication of integrated circuit 10. Once metal lines 26 have been formed to connect inductor L1 to oscillator circuit 32, this connection cannot be altered (i.e., the inductor has been configured to have a particular selected inductance value).

Because inductor L2 has different inductance values from inductor L1, inductor L2 may be used to provide a second tuning range. If it is desirable to operate voltage-controlled oscillator 22 in the second tuning range, metal lines 28 may be formed instead of lines 26 during fabrication of integrated circuit 10 (i.e., by selection of a photolithographic mask set that includes a pattern suitable for forming lines 28). When lines 28 are formed, lines 28 connect inductor L2 to circuit 32 (i.e., lines 28 switch inductor L2 into use in place of alternative inductor L1). Voltage-controlled oscillator 22 may have more tuning ranges by providing more inductors and connecting them accordingly to oscillator circuit 32. Generally, only one of the multiple inductors may be connected to oscillator circuit 32 at a time over a pair of associated metal lines. This provides voltage-controlled oscillator 22 with a desired frequency tuning range. If desired, more than one of the multiple inductors may be connected to oscillator circuit 32 at a time. In this configuration, the connected inductors may form a parallel arrangement that may result in additional inductance values and thus provide additional tuning ranges.

Optionally, voltage-controlled oscillator 22 may include a switch (not shown) to connect one or more inductors to oscillator circuit 32. For example, the switch may connect inductor L1 to oscillator circuit 32 while simultaneously disconnecting inductor L2 from oscillator circuit 32. The switch may also combine more than one inductor (e.g., two inductors such as inductors L1 and L2) in parallel or in series or in combinations thereof with oscillator circuit 32 to produce additional inductance values.

Oscillator circuit 32 may output signals to buffer circuit 34. Buffer circuit 34 may have an output that is connected to line 36 and may generate clock signal OUT at its output.

The voltage-controlled oscillator of FIG. 2A is merely illustrative. Any number of inductors may be formed to provide any number of frequency tuning ranges, if desired. Each inductor may have any desired number of turns.

Figure 2B:
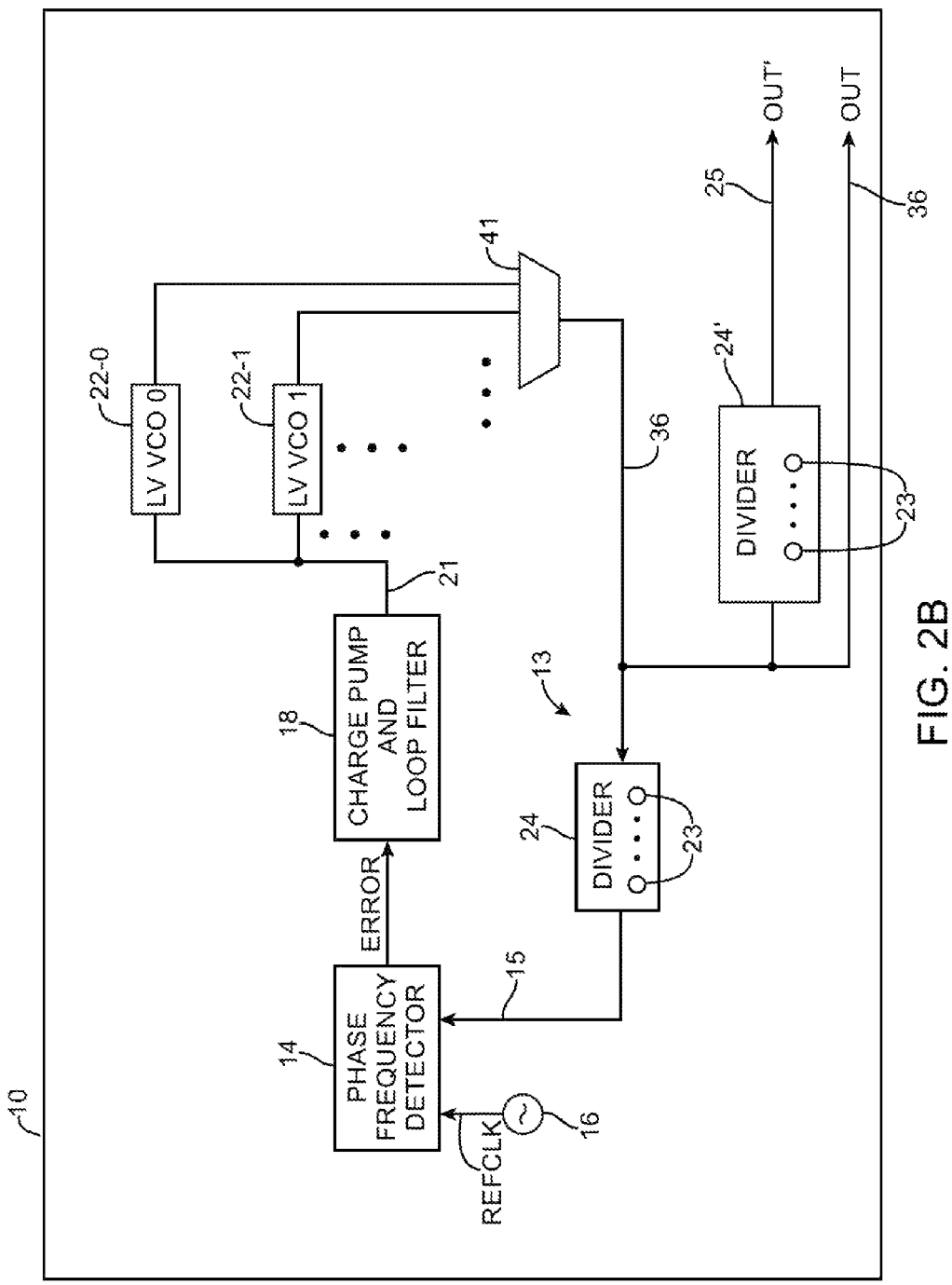
FIG. 2B is a diagram of an illustrative LC phase-locked loop circuit with multiple LC-based voltage-controlled oscillators in accordance with an embodiment of the present invention.

In a different embodiment as shown in FIG. 2B, phase-locked loop circuit 10 may have a selector 41 and multiple voltage-controlled oscillators 22 (e.g., LC VCO 0, LC VCO 1, etc.), each having a different inductor and varactor pair. Each voltage-controlled oscillator may provide signals from a different frequency range based on the inductor's inductance and the varactor's capacitance. Coarse frequency tuning may be implemented by connecting a suitable voltage-controlled oscillator and disconnecting all non-suitable voltage-controlled oscillators.

Configuring phase-locked loop circuit 10 by connecting and disconnecting a given voltage-controlled oscillator may be performed statically or dynamically. For example, selector 41 of phase-locked loop circuit 10 may be configured once during power-up to connect a given LC-based voltage-controlled oscillator 22 and generate signals at a given frequency range. Alternatively, phase-locked-loop circuit 10 may be configured and re-configured at runtime. For example, phase-locked loop circuit 10 may be configured to generate signals at a given frequency range. Later, phase-locked loop circuit 10 may be re-configured to generate signals at a different frequency range. Phase-locked loop circuit 10 may perform re-configuration by disconnecting the currently connected voltage-controlled oscillator and connecting a different voltage-controlled oscillator (e.g., using selector 41), thereby switching from generating signals at a given frequency range to generating signals at another frequency range.

Figure 3:
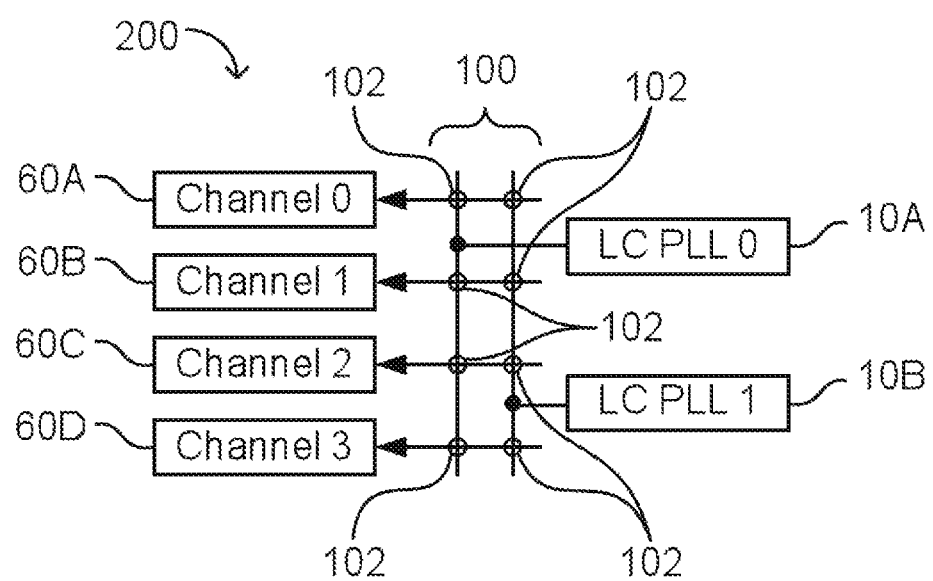
FIG. 3 is a diagram of illustrative high-speed serial interface circuitry having four channels and two LC PLLs, in which each channel may receive a clock signal generated by one of the two LC PLLs in accordance with an embodiment of the present invention.

FIG. 3 shows an illustrative diagram of high-speed serial interface circuitry 200 with four Rx/Tx channels 60A, 60B, 60C, and 60D. Each channel 60A through 60D may include physical media attachment (PMA) layer circuitry and optional physical coding sublayer (PCS) circuitry.

High-speed serial interface circuitry 200 may include LC-based PLL circuits LC PLL0 and LC PLL1 (shown as 10A and 10B in FIG. 3). Each of LC PLL0 and LC PLL1 may receive a respective reference clock signal, and may use that signal to produce clock signals that can be used by one or more of channels 60A through 60D to enable those channels to perform the operations described for them above.

The clock signals produced by LC PLL0 and LC PLL1 may be supplied to the various channels 60 using interconnection circuitry 100. Configurable connections 102 allow each of channels 60 to select clock signals from either LC PLL0 or LC PLL1. For example, all four channels 60A through 60D may select the same LC PLL (e.g., LC PLL0) and thereby operate in synchronized fashion. Alternatively, various channels may make different clock signal selections (e.g., channel 0 and channel 1 may select a clock signal produced by LC PLL0 and channel 2 and channel 3 may select a clock signal produced by LC PLL1) and thereby operate independently of the other channels. In a different scenario, channels 60 may receive clock signal(s) from LC PLL0 or LC PLL1 via dedicated paths (not shown). Dedicated paths may reduce the skew between channels receiving the same clock signal compared to receiving the clock signal over paths routed through configurable connections 102. Therefore, receiving a clock signal directly may be preferred for data rates above a given threshold (e.g., above 10 Gbps).

Some or all of the various channels 60 may have additional clock dividers. Those clock dividers may produce local clock signals by performing clock frequency division of the selected clock signal at the channel. These local clock signals may be shared among several channels and with additional circuitry outside the respective channels.

LC-based phase-locked loop circuit 10 may also produce more than one clock signal as shown in FIG. 2A. For example, LC PLL circuit 10 may include one or more divider 24' to produce one or more additional clock signal(s) on output 25 by frequency dividing the clock signal provided on output 36.

Figure 4:
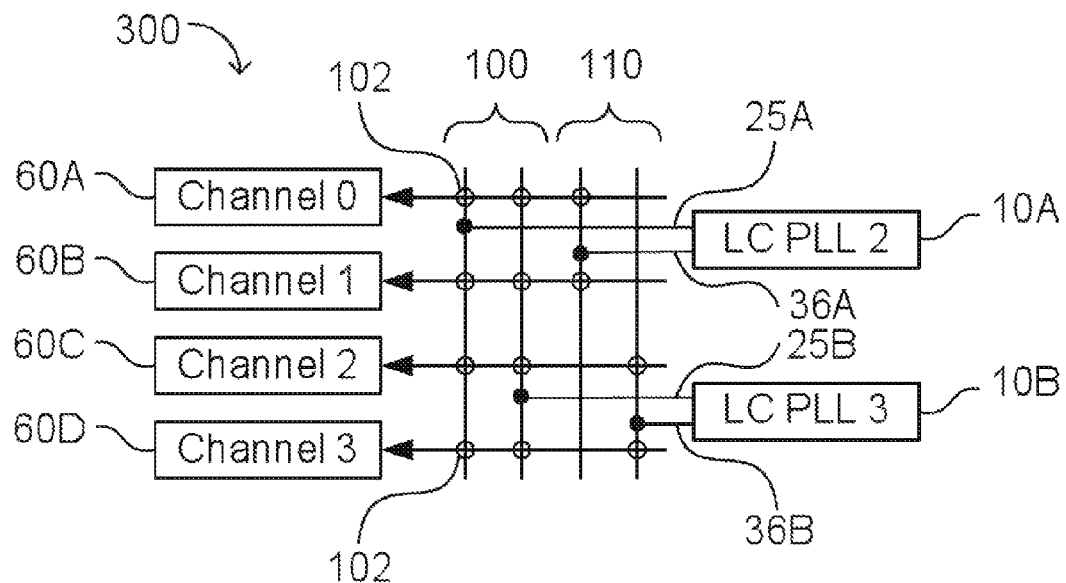
FIG. 4 is a diagram of illustrative high-speed serial interface circuitry having four channels and two LC PLLs, in which each LC PLL generates two clock signals and each channel may receive a clock signal generated by one of the two LC PLLs in accordance with an embodiment of the present invention.

FIG. 4 shows an illustrative diagram of high-speed serial interface circuitry 300 similar to high-speed serial interface circuitry 200. High-speed serial interface circuitry 300 includes four Rx/Tx channels 60A, 60B, 60C, and 60D and two LC-based phase locked loop (LC PLL) circuits LC PLL2 and LC PLL3 (shown as 10A and 10B in FIG. 4).

LC PLL2 and LC PLL3 may each produce two or more clock signals at two or more different frequencies. The frequency of the clock signal produced on outputs 36A and 36B may be determined by the respective LC voltage-controlled oscillator's inductance and capacitance values (see 22 in FIG. 2A). Additional clock signals 25A and 25B may be produced by frequency dividing the respective clock signals 36A and 36B.

The clock signals produced by LC PLL2 and LC PLL3 may be supplied to the various channels 60 using interconnection circuitry 100 and 110. Configurable connections 102 allow each of channels 60 to select clock signals produced by LC PLL2 and LC PLL3 on outputs 25A and 25B. For example, all four channels 60A through 60D may select the same LC PLL output (e.g., 25A of LC PLL2) and thereby operate in synchronized fashion. Alternatively, various channels may make different clock signal selections (e.g., channel 0 and channel 1 may select a clock signal produced on output 25A by LC PLL2 and channel 2 and channel 3 may select a clock signal produced on output 25B by LC PLL3) and thereby channels 0 and 1 may operate independently of channels 2 and 3.

Interconnection circuitry 110 may be configured to route clock signals produced by LC PLL2 and LC PLL3 on outputs 36A and 36B to channels 60. Interconnection circuitry 110 may restrict the connections between channels 60 and LC PLL2 and LC PLL3 by providing limited configurable connections 102. For example, as shown in FIG. 4, channels 60A and 60B may receive clock signals produced on output 36A of LC PLL2 over interconnection circuitry 110, and channels 60C and 60D may receive clock signals produced on output 36B of LC PLL3 over interconnection circuitry 110.

In a different scenario, channels 60 may receive clock signal(s) from LC PLL2 or LC PLL3 via dedicated paths (not shown). Dedicated paths may reduce the skew between channels receiving the same clock signal compared to receiving the clock signal over paths routed through configurable connections 102. Therefore, receiving a clock signal directly may be preferred for data rates above a given threshold (e.g., above 10 Gbps).

High-speed serial interface circuits 200 as described in connection with FIG. 3 and circuits 300 as described in connection with FIG. 4 are merely illustrative and do not limit the scope of the present invention. If desired, high-speed serial interface circuits 200 and 300 may include any arbitrary number of receive and transmit channels and any arbitrary number of LC-based phase-locked loop circuits. For example, high-speed serial interface circuits 200 and 300 may have 2, 6, 8, 12, 24, 36, or more channels, just to name a few. Each of these channels may have one or more associated LC-based phase-locked loop circuit(s). Other arrangements for combining receive and transmit channels with LC PLL circuits are possible. For example, 2, 4, 6, 8, 16, or other suitable number of channels may share one LC PLL circuit.

Figure 5:
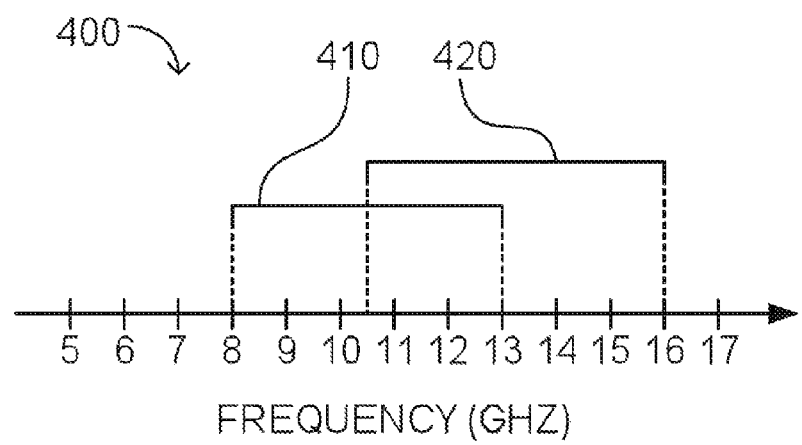
FIG. 5 is a diagram showing possible overlapping frequency ranges that cover an octave and can be generated with two phase-locked loop circuits in accordance with an embodiment of the present invention.

LC-based phase-locked loop circuits of the types described in connection with FIGS. 2, 3, and 4 may be used to provide two partly overlapping frequency ranges, as shown in FIG. 5. For example, if inductor L1 were actively connected to oscillator circuit 32 (see, FIG. 2A), the phase-locked loop circuit may have a first operating frequency range as indicated by range 410 (e.g., from 8 GHz to 13 GHz). If inductor L2 were actively connected to the oscillator circuit and inductor L1 disconnected, the phase-locked loop circuit may have a second operating frequency range as indicated by range 420 (e.g., from 9 GHz to 14 GHz).

Ranges 410 and 420 may be partly overlapping to provide margin to compensate for potential process variations. The varactor of the oscillator circuit may be tuned to operate the LC-based phase-locked loop circuit at any desired frequency within the frequency range provided by the selected inductor. For example, in a scenario in which inductor L1 is connected to the oscillator circuit, the varactor may be tuned to provide the LC-based phase-locked loop circuit with any operating frequency within range 410.

The frequency range of the phase-locked loop circuit may be further adjusted by tuning the associated voltage regulator. Varying the oscillator supply voltage generated by the voltage regulator (not shown) may shift the frequency range.

The operating frequency ranges shown in FIG. 5 are merely illustrative. Any desired frequency range may be covered by any suitable number of inductors. The operating frequencies may be shifted and adjusted by any amount by tuning the associated varactor and voltage regulator, if desired. Alternatively, two LC-based PLL circuits may be used to generate frequency ranges 410 and 420. For example, LC PLL0 of FIG. 3 may produce signals within frequency range 410 while LC PLL1 produces signals within frequency range 420.

Figure 6:
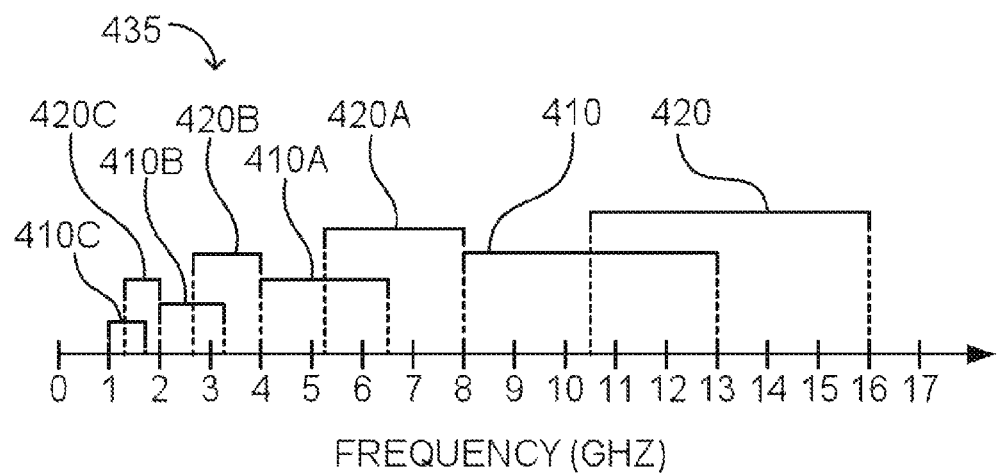
FIG. 6 is a diagram showing possible overlapping frequency ranges of FIG. 5 and the frequency ranges obtained by dividing the initial frequency ranges from FIG. 5 by two, four, and eight in accordance with an embodiment of the present invention.

LC-based phase-locked loop circuit 10 (displayed in FIG. 2A) may produce additional frequency ranges using divider 24' as illustrated in FIG. 6. For example, LC-based phase-locked loop circuit 10 may produce frequency ranges 410A and 420A by dividing the frequency ranges 410 (e.g., from 8 GHz to 13 GHz) and 420 (e.g., from 10.5 GHz to 16 GHz) by a factor of two respectively. In this scenario, frequency range 410A would cover frequencies ranging from 4 GHz to 6.5 GHz, whereas frequency range 420A would cover frequencies ranging from 5.25 GHz to 8 GHz. Accordingly, LC-based phase-locked loop circuit 10 may produce frequency ranges 410B and 420B or 410C and 420C by dividing frequency ranges 410 and 420 by a factor of four or eight, respectively. Thus, LC-based phase-locked loop circuit 10 may produce signals with frequencies in the range from 1 GHz to 16 GHz.

LC-based phase-locked loop circuit 10 may produce signals from a broader frequency range by further dividing frequency ranges 410 and 420 (e.g., by factors of 16, 32, 64, 128, etc.).

If desired, depending on divider 24', LC-based phase-locked loop circuit 10 may produce a signal having any frequency in the range between almost zero and the upper limit of range 420 (e.g., 16 GHz as shown in FIG. 6). For example, LC-based phase-locked loop circuit 10 may produce such a signal on output 36 of LC-based voltage-controlled oscillator 22 (as shown in FIG. 2A). In this scenario, the frequency of the signal may be in the range 410 or 420. Alternatively, LC-based phase-locked loop circuit 10 may produce such a signal through integer division of a signal produced by voltage-controlled oscillator 22 on output 25 of divider 24'. In this scenario, the frequency of the signal may be in the range 410A, 420B, 410C, 420A, 420B, or 420C.

LC-based phase-locked loop circuit 10 may produce any frequency in the range between almost zero and the upper limit of 420 (e.g., with voltage-controlled oscillator 22 and divider 24'), because the union of frequency ranges 410 and 420 covers a continuous range where the frequency of the upper limit of range 420 is at least double the frequency of the lower limit of range 410.

Figure 7:
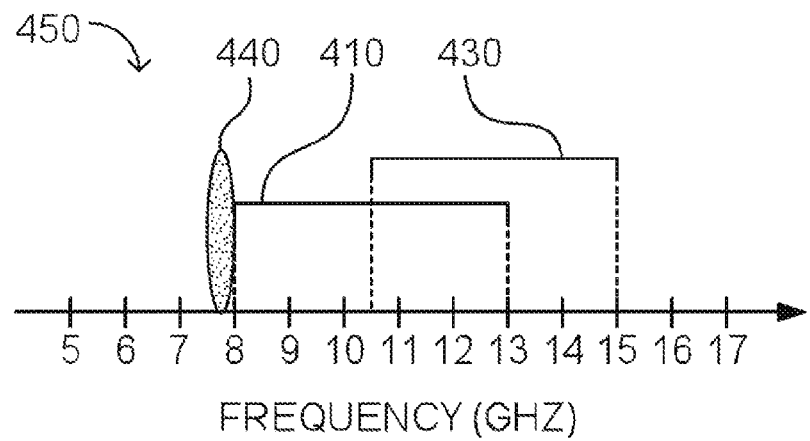
FIG. 7 is a diagram showing possible overlapping frequency ranges that cover less than an octave and can be generated with two phase-locked loop circuits and a frequency range that cannot be covered by integer division of the initial frequency ranges in accordance with an embodiment of the present invention.

Consider a scenario in which the frequency of the upper limit of one frequency range is smaller than double the frequency of another frequency range. An example for such a scenario is shown in FIG. 7 where a voltage-controlled oscillator of an LC-based phase-locked loop circuit may produce signals in frequency range 410 (e.g., ranging from 8 GHz to 13 GHz) and in frequency range 430 (e.g., ranging from 10.5 GHz to 15 GHz). In this scenario, LC-based phase-locked loop circuit may not produce signals in frequency range 440 (e.g., ranging from 7.5 GHz to 8 GHz) neither directly with the voltage-controlled oscillator nor through integer division of signals produced by the voltage-controlled oscillator. Frequency range 440 is sometimes also referred to as a frequency "hole".

Multiple LC-based phase-locked loop circuits may be used together to provide a wide variety of clock signals in different frequency ranges. FIGS. 3 and 4 show examples for using two LC-based phase-locked loop circuits providing clock signals to four channels of a high-speed serial interface circuit. Consider the scenario where two LC PLL circuits each include two inductors and a varactor. In this scenario, each of the two LC PLL circuits may produce clock signals from two different frequency ranges by combining one of the two inductors with the varactor.

Figure 8:
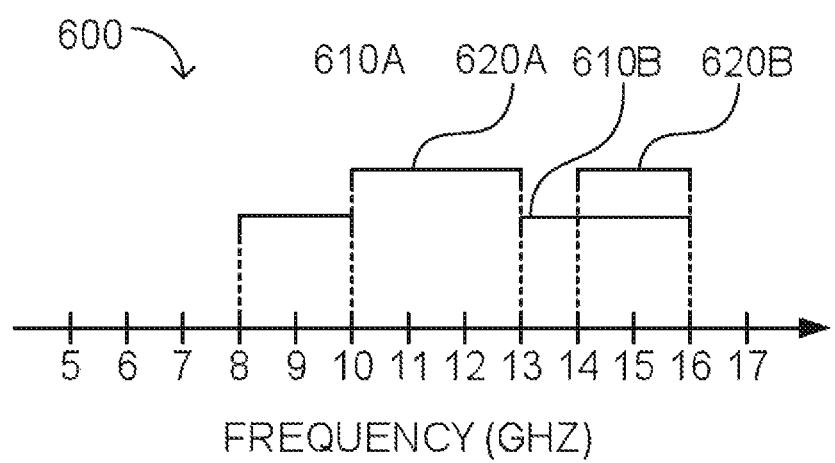
FIG. 8 is a diagram showing possible contiguous frequency ranges that cover an octave and can be generated with two phase-locked loop circuits in accordance with an embodiment of the present invention.

Illustrative frequency ranges produced by two such LC PLL circuits such as LC PLL circuits 10A and 10B from FIGS. 3 and 4 are presented in FIG. 8. For example, the first LC PLL circuit 10A may produce signals in frequency ranges 610A (e.g., 8 GHz to 10 GHz) and 610B (e.g., 13 GHz to 16 GHz) while the second LC PLL circuit 10B may produce signals in frequency ranges 620A (e.g., 10 GHz to 13 GHz) and 620B (e.g., 14 GHz to 16 GHz). In this example, the union of the frequency ranges 610A, 610B, 620A, and 620B cover a continuous range of frequencies where the upper limit of 610B and 620B (e.g., 16 GHz) has twice the frequency compared to the lower limit of 610A (e.g., 8 GHz). The first and second LC PLL circuits may thus generate signals having any arbitrary frequency in the range from almost zero to the upper limit of ranges 610B and 620B (e.g., 16 GHz).

In the example of FIG. 8, the two LC PLL circuits produce signals in frequency ranges that overlap at the higher of the two frequency ranges (610B and 620B in FIG. 8) produced by each LC PLL circuit. It may be desirable to produce such a frequency range overlap, for example in the scenario that the overlapping range covers operating frequencies of common communication protocols. For example, the Optical Internetworking Forum (OIF) defines the Common Electrical Interface (CEI) standard for 28G Very Short Reach (VSR), Short Reach (SR), and Long Reach (LR) standard, sometimes also referred to as CEI-28G-VSR, CEI-28G-SR, and CEI-28G-LR. These standards require a serializer/deserializer operating at 28 Gbps, thereby requiring a clock signal operating at 14 GHz. In the example provided in FIG. 8, frequency ranges 610B and 620B overlap at the frequency range required by the CEI-28G standards.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using high-speed serial interface circuitry is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit comprising:
a first inductor-based phase-locked loop circuit having a first output, wherein the first phase-locked loop circuit generates a first control signal in a first frequency range at the first output;
a second inductor-based phase-locked loop circuit having a second output, wherein the second phase-locked loop circuit generates a second control signal in a second frequency range at the second output, wherein the first and second frequency ranges partially overlap with respect to one another, and wherein the first and second inductor-based phase-locked loop circuits operate at different frequencies when the first inductor-based phase-locked loop circuit is operated at a given frequency in the first frequency range that does not overlap with the second frequency range; and
interconnect circuitry coupled to the first and second outputs, wherein the interconnect circuitry receives the first control signal from the first output and receives the second control signal from the second output, and wherein the interconnect circuitry is configured to select between the received signals.

2. The integrated circuit of claim 1, further comprising:
a high-speed serial interface circuit having a plurality of channels, wherein each channel of the plurality of channels is coupled to at least one of the first and second outputs via the interconnect circuitry.

3. The integrated circuit of claim 2, wherein the integrated circuit comprises a programmable integrated circuit.

4. The integrated circuit of claim 2, wherein at least one of the first and second control signals affects a transmission of data via a channel in the plurality of channels.

5. The integrated circuit of claim 4, wherein a first portion of the plurality of channels of the high-speed serial interface circuit is controlled by the first control signal and a second portion of the plurality of channels of the high-speed serial interface circuit is controlled by the second control signal.

6. The integrated circuit of claim 1, wherein the first and second frequency ranges cover a continuous frequency range.

7. The integrated circuit of claim 6, wherein the first and second inductor-based phase-locked loop circuits are configured such that an upper portion of the first frequency range overlaps with a lower portion of the second frequency range.

8. The integrated circuit of claim 6, wherein the first and second inductor-based phase-locked loop circuits are configured such that the second frequency range has an upper limit that is at least double in frequency compared to a lower limit of the first frequency range.

9. The integrated circuit of claim 7, wherein the lower portion of the second frequency range that overlaps with the upper portion of the first frequency range covers a given set of communication protocol standards supported by the high-speed serial interface circuit.

10. A high-speed serial interface circuit comprising:
first phase-locked loop circuitry configured to generate a first clock signal within first and second frequency ranges;
second phase-locked loop circuitry configured to generate a second clock signal within third and fourth frequency ranges, wherein a union of the first, second, third, and fourth frequency ranges covers a continuous frequency range, wherein the continuous frequency range comprises an upper limit and a lower limit, and wherein the upper limit is at least double in frequency compared to the lower limit; and
a plurality of channels, wherein each channel is connected to one of the first and second phase-locked loop circuitries, and wherein each channel is configured to receive a selected one of the first and second clock signals.

11. The high-speed serial interface circuit of claim 10, wherein the first phase-locked loop circuitry further comprises:
a plurality of inductors each having a unique inductance value.

12. The high-speed serial interface circuit of claim 11, wherein a subset of the first frequency range overlaps with a subset of the third frequency range.

13. The high-speed serial interface circuit of claim 12, wherein the second frequency range is disjoint from the fourth frequency range.

14. The high-speed serial interface circuit of claim 12, wherein the first and third frequency ranges cover higher frequencies than the second and fourth frequency ranges.

15. The high-speed serial interface circuit of claim 14, wherein a portion of the plurality of channels is coupled with the first phase-locked loop circuitry and is configured to receive the first clock signal in the first frequency range.

16. The high-speed serial interface circuit of claim 15, wherein another portion of the plurality of channels is coupled with the second phase-locked loop circuitry and is configured to receive the second clock signal in the third frequency range.

17. A method for operating high-speed serial interface circuitry having a plurality of channels and first and second phase-locked loop circuits, wherein each of the first and second phase-locked loop circuits includes a plurality of inductors, the method comprising:
with the first phase-locked loop circuit, producing first control signals in a first frequency range;
with the second phase-locked loop circuit, producing second control signals in a second frequency range, wherein the first and second frequency ranges are partially overlapping with respect to one another; and
receiving one of the first control signals in a subset of the plurality of channels.

18. The method defined in claim 17 further comprising:
receiving one of the second control signals in a second subset of the plurality of channels, wherein the first and second subsets in the plurality of channels are disjoint.

19. The method defined in claim 17, wherein the first phase-locked loop circuit is operable to produce signals from at least two disjoint frequency ranges.

20. The method defined in claim 17, wherein a union of the first and second frequency ranges covers a continuous frequency range.

21. The method defined in claim 20, wherein the continuous frequency range has an upper frequency limit and a lower frequency limit, and wherein the upper frequency limit of the continuous frequency range is at least double in frequency compared to the lower frequency limit of the continuous frequency range.

* * * * *